(12) United States Patent
Isoda et al.

(10) Patent No.: US 12,225,676 B2
(45) Date of Patent: Feb. 11, 2025

(54) PROGRAMMABLE LOGIC CONTROLLER, AND BASE UNIT AND MODULE UNITS THEREOF

(71) Applicant: Mitsubishi Electric Corporation, Tokyo (JP)

(72) Inventors: Yohei Isoda, Tokyo (JP); Yoshikazu Murata, Tokyo (JP); Masatoshi Toyonaga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/723,883

(22) PCT Filed: Jun. 16, 2022

(86) PCT No.: PCT/JP2022/024063
§ 371 (c)(1),
(2) Date: Jun. 25, 2024

(87) PCT Pub. No.: WO2023/243025
PCT Pub. Date: Dec. 21, 2023

(65) Prior Publication Data
US 2024/0422935 A1    Dec. 19, 2024

(51) Int. Cl.
*H05K 7/14*    (2006.01)
(52) U.S. Cl.
CPC ......... *H05K 7/1474* (2013.01); *H05K 7/1465* (2013.01)
(58) Field of Classification Search
CPC .. H05K 7/1474; H05K 7/1465; H05K 5/0017; H05K 5/0217

(Continued)

(56) References Cited

U.S. PATENT DOCUMENTS

| | | | |
|---|---|---|---|
| 9,577,415 B1* | 2/2017 | Veloskey | H05K 5/0026 |
| 11,917,770 B2* | 2/2024 | Kim | H05K 5/0217 |
| 2021/0289653 A1 | 9/2021 | Beckhoff | |

FOREIGN PATENT DOCUMENTS

| | | |
|---|---|---|
| JP | S59-106267 U | 7/1984 |
| JP | H02-012994 A | 1/1990 |

(Continued)

OTHER PUBLICATIONS

Decision to grant a patent issued on May 16, 2023, in corresponding Japanese Patent Application No. 2022-578681, 5pp.

(Continued)

*Primary Examiner* — Hung S. Bui
(74) *Attorney, Agent, or Firm* — XSENSUS LLP

(57) ABSTRACT

A programmable logic controller capable of maintaining waterproofness or dustproofness includes a base unit with a substrate, a base case housing the substrate, and at least one holding part to hold a connection unit which is one of a plurality of module units. The connection unit includes a module-side connector, an engagement mechanism to be detachably engaged with the at least one holding part, and a module case with a fitting tenon to be engaged with the base case. The programmable logic controller includes an elastic member to apply a force in a first direction, which is a direction in which the connection unit moves away from the base unit, thereby pressing the engagement mechanism of the connection unit against the at least one holding part of the base unit, and a sealing member to seal a gap between the base case and the fitting tenon of the module case.

13 Claims, 21 Drawing Sheets

(58) Field of Classification Search
USPC .................................. 361/728, 807, 809, 810
See application file for complete search history.

(56) References Cited

FOREIGN PATENT DOCUMENTS

| | | | | | |
|---|---|---|---|---|---|
| JP | H03-136300 | A | | 6/1991 | |
| JP | 2001024363 | A | * | 1/2001 | .............. H05K 7/14 |
| JP | 2007-165048 | A | | 6/2007 | |
| JP | 2012-216481 | A | | 11/2012 | |
| JP | 2012-256125 | A | | 12/2012 | |
| JP | 5774251 | B2 | | 9/2015 | |
| JP | 6717420 | B1 | | 7/2020 | |
| JP | 6865912 | B1 | | 4/2021 | |
| JP | 2022-515509 | A | | 2/2022 | |
| WO | 2014/132411 | A1 | | 9/2014 | |
| WO | WO-2015173956 | A1 | * | 11/2015 | .............. G05B 19/05 |

OTHER PUBLICATIONS

International Search Report and Written Opinion mailed on Aug. 16, 2022, received for PCT Application No. PCT/JP2022/024063, filed on Jun. 16, 2022, 11 pages including English Translation.
Notice of Reasons for Refusal mailed on Feb. 14, 2023, received for JP Application 2022-578681, 06 pages including English Translation.

* cited by examiner

PROGRAMMABLE LOGIC CONTROLLER, AND BASE UNIT AND MODULE UNITS THEREOF

CROSS-REFERENCE TO RELATED APPLICATION

This application is based on PCT filing PCT/JP2022/024063, filed Jun. 16, 2022, the entire contents of which are incorporated herein by reference.

TECHNICAL FIELD

The present disclosure relates to a programmable logic controller, and a base unit and module units thereof.

BACKGROUND ART

A conventional programmable logic controller (hereinafter, referred to as "PLC") includes a base unit and module units connected to the base unit. A standard input/output module unit is connected to a network interface, which is a type of module unit, via a network cable. A packing having elasticity is attached to the periphery of a connector included in the standard input/output module unit, and a packing is similarly attached to the periphery of a connector of a safety circuit unit to be connected to the former connector (for example, see Patent Document 1).

PRIOR ART DOCUMENTS

Patent Documents

[Patent Document 1] Japanese Patent No. 6865912

SUMMARY OF THE INVENTION

Problems to be Solved by the Invention

For example, when a module unit is installed to the base unit, in some cases, one end of the module unit is hooked to the base unit, and then the other end of the module unit is pressed toward the base unit, thereby engaging the module unit with the base unit and causing the base unit to hold the module unit. In this case, since the base unit and the module units are not fixed with screws or other means, the module units are prone to swaying due to external shocks.

In the above PLC, when a substrate of the base unit is housed in a base case and a sealing member such as a packing is provided between the base case and each module unit to protect the substrate from surrounding water or dust, the sealing member may be twisted or rubbed due to the vibration of the module units caused by external shocks. As a result, the sealing member is easily damaged, and waterproofness and dustproofness of the sealing member do not last.

The present disclosure is made to solve the above-mentioned problems and to obtain a PLC, a base unit of the PLC and module units of the PLC capable of maintaining waterproofness and dustproofness of sealing members.

Means for Solving the Problems

A PLC according to the present disclosure is a programmable logic controller including a base unit; and a plurality of module units to be connected to the base unit, wherein the base unit includes: a substrate having a plurality of base-side connectors and electrically connecting the plurality of module units via the plurality of base-side connectors; a base case having an opening through which one of the plurality of base-side connectors is exposed and housing the substrate; and at least one holding part to hold a connection unit which is one of the plurality of module units, wherein the connection unit includes: a module-side connector to be connected to one of the plurality of base-side connectors; an engagement mechanism to be detachably engaged with the at least one holding part of the base unit; and a module case having a fitting tenon formed in such a manner as to be fitted with the base case and to surround the module-side connector, wherein the programmable logic controller further includes: an elastic member to exert a force in a first direction, which is a direction in which the connection unit moves away from the base unit, for pressing the engagement mechanism of the connection unit against the at least one holding part of the base unit; and a sealing member to seal a gap between the base case and the fitting tenon of the module case, and wherein the at least one holding part is provided in plurality to form pairs, and the pair of holding parts has at least one slant face inclined with respect to the first direction such that the force exerted by the elastic member is applied in a second direction intersecting the first direction.

A base unit according to the present disclosure includes: a substrate having a plurality of base-side connectors and electrically connecting the plurality of module units via the plurality of base-side connectors; a base case having openings through which the plurality of base-side connectors are exposed and housing the substrate; at least one holding part to hold a connection unit which is one of the plurality of module units by being engaged with an engagement mechanism of the connection unit; an elastic member to exert a force in a first direction, which is a direction in which the connection unit moves away from the base unit, for pressing the engagement mechanism of the connection unit against the at least one holding part of the base unit; and a sealing member to seal a gap between a fitting tenon of the module case of the connection unit and the base case, the fitting tenon being formed such that it surrounds the module-side connector of the connection unit to be connected to one of the plurality of base-side connectors, wherein the at least one holding part is provided in plurality to form pairs, and the pair of holding parts has at least one slant face inclined with respect to the first direction such that the force exerted by the elastic member is applied in a second direction intersecting the first direction.

A module unit according to the present disclosure includes: a module-side connector to be connected to one of the base-side connectors of the base unit; an engagement mechanism to be detachably engaged with the at least one holding part of the base unit; a module case having a fitting tenon formed in such a manner as to be fitted with the base case and to surround the module-side connector; an elastic member to exert a force in a first direction, which is a direction in which the module unit moves away from the base unit, for pressing the engagement mechanism of the module unit against the at least one holding part of the base unit; and a sealing member to seal a gap between the base case and the fitting tenon of the module case, wherein the at least one holding part is provided in plurality to form pairs, and the pair of holding parts has at least one slant face inclined with respect to the first direction such that the force exerted by the elastic member is applied in a second direction intersecting the first direction.

Effects of the Invention

According to the present disclosure, it is possible to obtain a PLC, a base unit of the PLC and module units of the PLC capable of maintaining waterproofness and dustproofness by sealing members.

EMBODIMENTS FOR CARRYING OUT THE INVENTION

Embodiment 1

Figure 1:
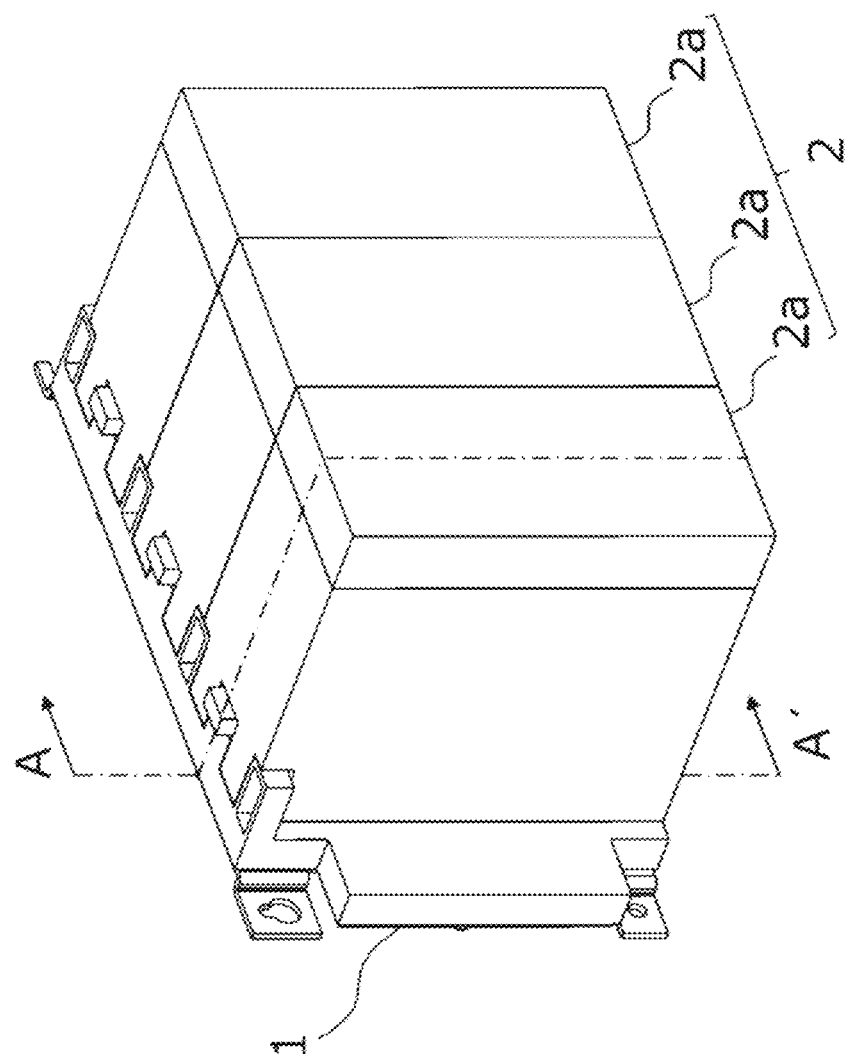
FIG. 1 is a perspective view of a PLC according to Embodiment 1.

A PLC according to Embodiment 1 will be described. Note that the same reference numerals in each drawing represent the same or equivalent configurations. As shown in FIG. 1, the PLC includes a base unit 1 and a plurality of module units 2. The plurality of module units 2 are fixed to the base unit 1 side by side. Each of the plurality of module units 2 to be connected to the base unit 1 is referred to as a connection unit 2a.

In the following description, the direction in which the connection unit 2a moves away from the base unit 1 is referred to as the longitudinal direction, and the direction parallel to the direction in which the plurality of module units 2 are lined up is referred to as the lateral direction. The lateral direction is a direction that intersects with the longitudinal direction, and is perpendicular to the longitudinal direction and the height direction, which will be described later. Also, the side of the base unit 1 relative to the module units 2 is referred to as the rear side, and the side of the module units 2 relative to the base unit 1 is referred to as the front side, as appropriate. Note that the longitudinal direction corresponds to a first direction, and either the lateral direction or the height direction, which will be described later, corresponds to a second direction.

Figure 2:
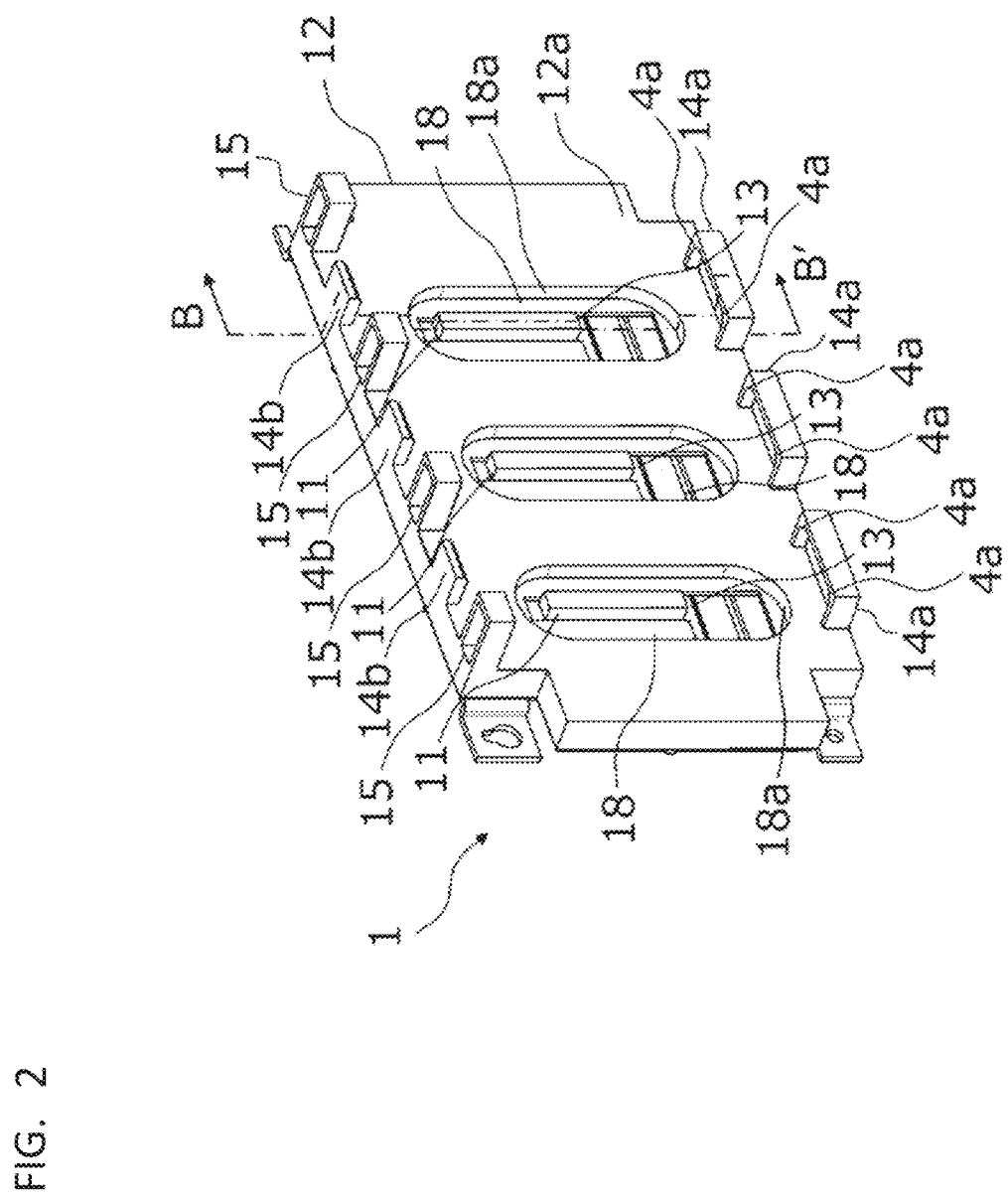
FIG. 2 is a perspective view of a base unit according to Embodiment 1.
Figure 3:
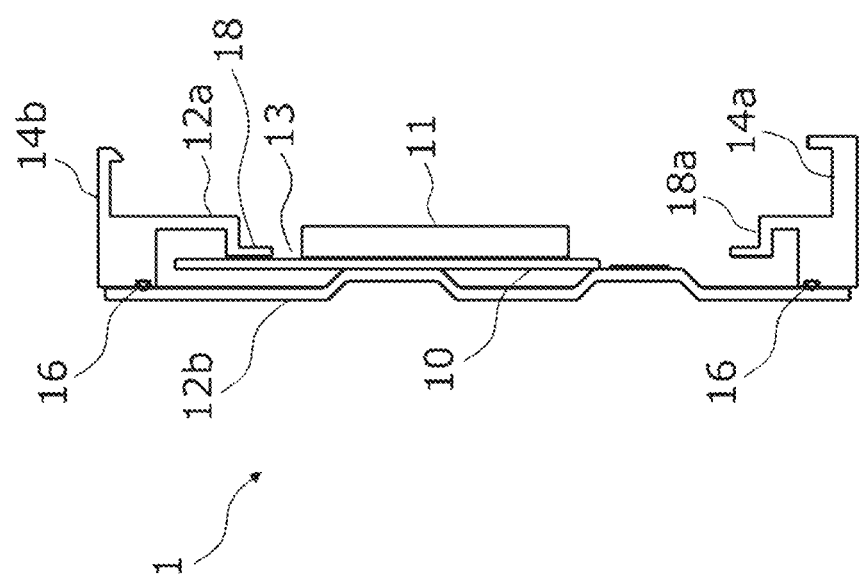
FIG. 3 is a B-B' cross-sectional view of the base unit according to Embodiment 1.

A perspective view of the base unit 1 is shown in FIG. 2, and a B-B' cross-sectional view of the base unit 1 is shown in FIG. 3. The base unit 1 includes a substrate 10 and a base case 12 that houses the substrate 10. The substrate 10 includes a plurality of base-side connectors 11. A module-side connector 20 of the connection unit 2a, which will be described later, is connected to one of the plurality of base-side connectors 11. The substrate 10 electrically connects the plurality of module units 2 via the plurality of base-side connectors 11 by each module-side connector 20 being connected to each base-side connector 11.

The base case 12 includes a front cover 12a and a rear cover 12b. The front cover 12a is, for example, a resin member or a metal member. The rear cover 12b is, for example, a press-formed metal member. The base case 12 houses the substrate 10 by sandwiching it between the front cover 12a and the rear cover 12b. Further, a packing 16 is sandwiched between the front cover 12a and the rear cover 12b. Since the packing 16 is provided in such a manner as to surround the substrate 10, water or dust can be prevented from entering between the front cover 12a and the rear cover 12b, and the substrate 10 is not exposed to water or dust.

Recesses 18 of rounded rectangular shape are formed in the front cover 12a, which are recessed toward the rear side. Each of the recesses 18 is a fitting mortise that accepts a fitting tenon 22a of a module case 22, which will be described later. Further, each of the recesses 18 has an opposing face 18a facing a lateral face 22aa of the fitting tenon 22a, which will be described later. Further, the each of the recesses 18 has an opening 13 through which one of the plurality of base-side connectors 11 of the substrate 10 is to be exposed.

The front cover 12a has a plurality of holding parts to hold the connection units 2a. The plurality of holding parts is provided in pairs. Each pair of the holding parts 14 formed in the plurality of holding parts is referred to as a pair of holding parts 14. A first holding part 14a, which is one of the paired holding parts 14, is formed in such a manner as to extend toward the longitudinal direction from one end of the front cover 12a. A second holding part 14b, which is one of the paired holding parts 14, is formed in such a manner as to extend toward the longitudinal direction from the other end of the front cover 12a. Therefore, the first holding part 14a and the second holding part 14b face each other across the opening 13. The height direction is a direction parallel to the direction from the first holding part 14a to the second holding part 14b. The height direction is a direction that intersects with the longitudinal direction.

Ends on both sides of the lateral direction and the end of the front side of the first holding part 14a ascend straight up toward the second holding part 14b. The first holding part 14a has slant faces 4a inclined with respect to the longitudinal direction such that the force due to a leaf spring 31, described later, is applied in the lateral direction. The plurality of slant faces 4a are provided in such a manner that each of first engaging parts 21a, which will be described later, of the connection units 2a is sandwiched from both sides in the lateral direction, and the distance between the slant faces 4a becomes gradually narrower toward the longitudinal direction.

Figure 4:
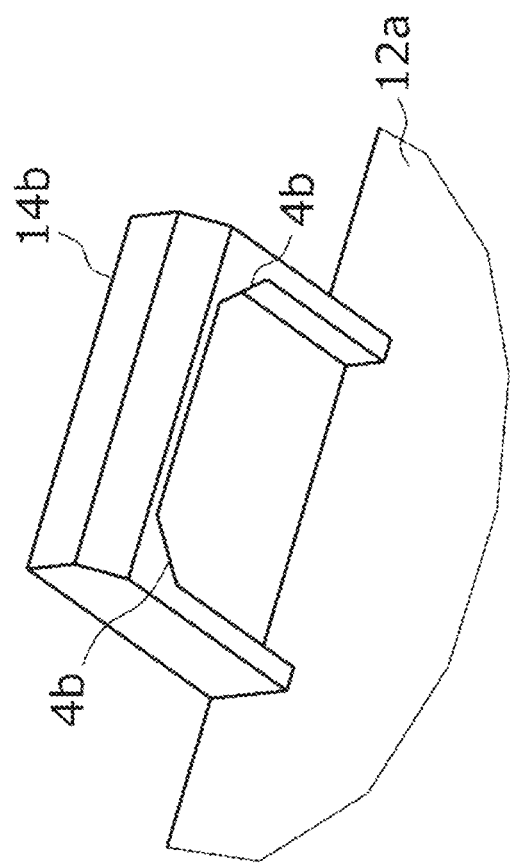
FIG. 4 is a perspective view of a second holding part according to Embodiment 1.

FIG. 4 shows a perspective view of the second holding part 14b viewed from the side of the first holding part 14a. As shown in FIG. 4, the ends on both sides of the lateral direction and the end of the front side of the second holding part 14b descend straight down toward the first holding part 14a. The second holding part 14b has slant faces 4b inclined with respect to the longitudinal direction such that the force exerted by the leaf spring 31, described later, is applied in the lateral direction. The plurality of slant faces 4b are provided in such a manner that each of second engaging parts 21b, which will be described later, of the connection units 2a is sandwiched from both sides in the lateral direction, and the distance between the slant faces 4b becomes gradually narrower toward the longitudinal direction.

As shown in FIG. 2, the front cover 12a has a plurality of guide parts 15 formed in such a manner as to extend toward the longitudinal direction from the other end of the front cover 12a. The guide parts 15 each have a hollow rectangular parallelepiped shape open on both sides of the height direction. The plurality of guide parts 15 are provided in such a manner that at least two of the plurality of guide parts 15 are brought adjacent to each module case 22, which will be described later, when the connection units 2a are held by the base unit 1. In the present embodiment, the guide parts 15 are arranged such that two of the guide parts are brought adjacent to each module case 22, described later, when the connection units 2a are held by the base unit 1.

Figure 5:
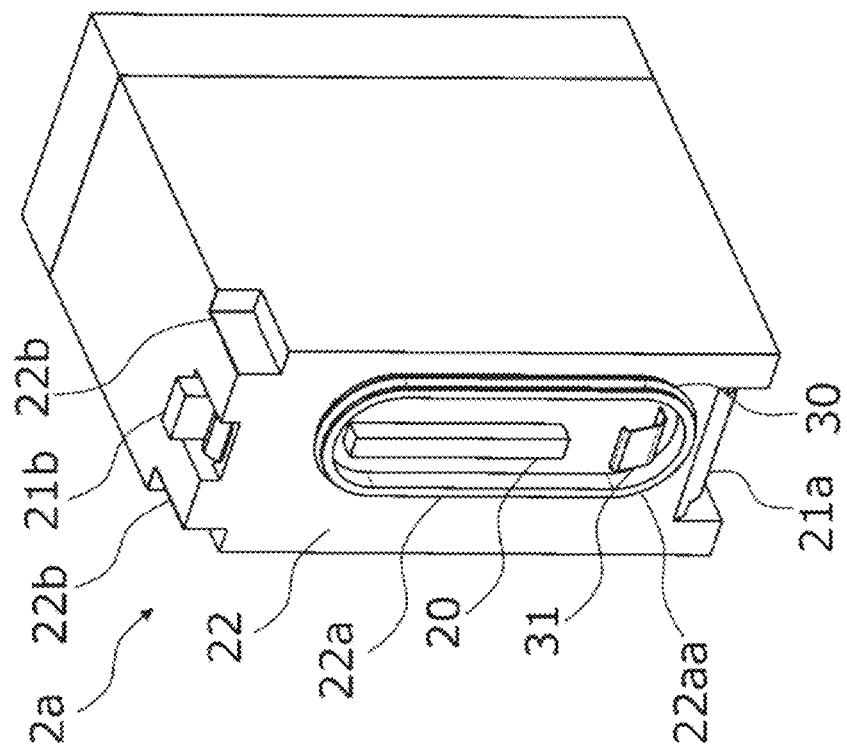
FIG. 5 is a perspective view of a connection unit according to Embodiment 1.

FIG. 5 shows a perspective view of the connection unit 2a, which is one of the plurality of module units 2, as seen from the rear side. The connection unit 2a includes the module-side connector 20 connected to one of the plurality of base-side connectors 11. Further, the connection unit 2a includes the module case 22. The module case 22 has the fitting tenon 22a of rounded rectangular shape that fits into one of the recesses 18 of the front cover 12a of the base case 12 and surrounds the module-side connector 20. The connection unit 2a includes an engagement mechanism 21 which detachably engages with a pair of the holding parts 14 of the base unit 1. The engagement mechanism 21 includes a first engaging part 21a and a second engaging part 21b. The engagement mechanism is provided such that the first engaging part 21a engages with the first holding part 14a and the second engaging part 21b engages with the second holding part 14b at one end and the other end of the module case 22 in the height direction, respectively.

Figure 6:
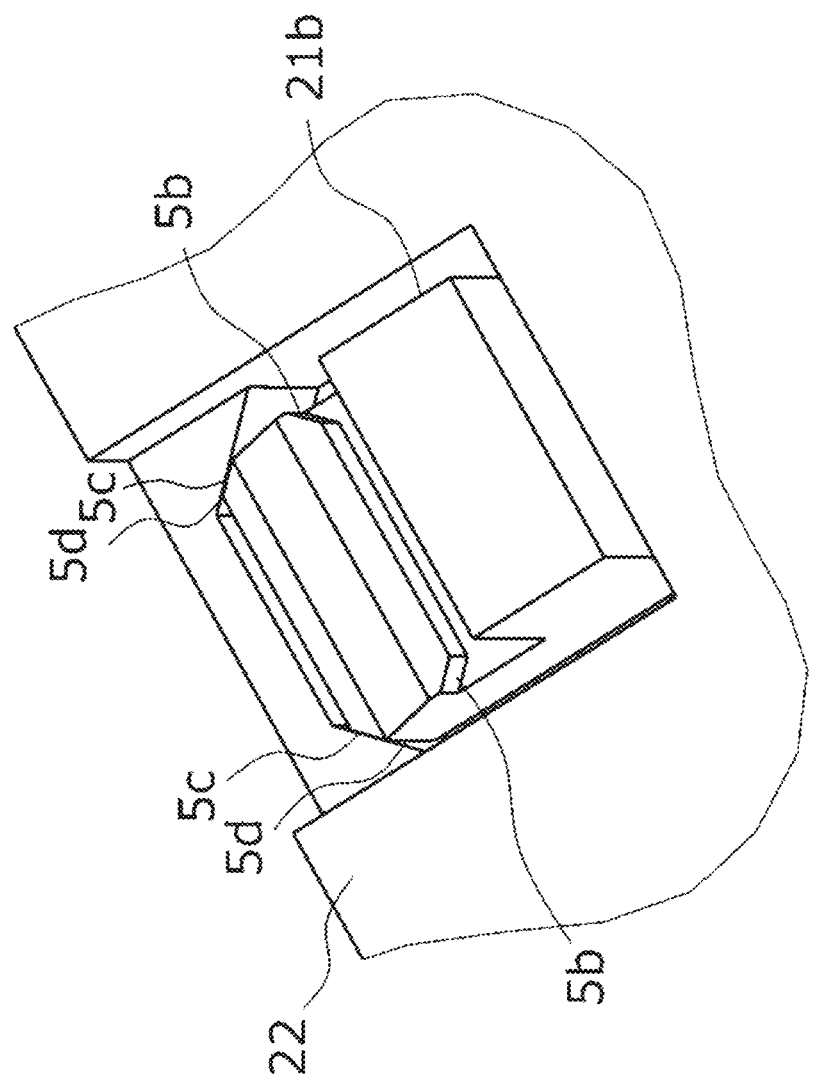
FIG. 6 is a perspective view of a second engaging part according to Embodiment 1.

The first engaging part 21a has slant faces 5a, which will be described later. FIG. 6 shows a perspective view of the second engaging part 21b. The second engaging part 21b has slant faces 5b inclined with respect to the longitudinal direction such that the force exerted by the leaf spring 31 is applied in the lateral direction. The slant faces 5b are formed to be inclined such that the width in the lateral direction becomes gradually narrower toward the longitudinal direction. The slant faces 5b are brought into contact with the slant faces 4b of the second holding part 14b when the connection unit 2a is held by the base unit 1.

The second engaging part 21b has slant faces 5c inclined with respect to the longitudinal direction such that the force exerted by the leaf spring 31 is applied in the lateral direction. The slant faces 5c are formed to be inclined such that the width in the lateral direction becomes gradually wider toward the longitudinal direction. The module case 22 has a plurality of slant faces 5d in such a manner as to sandwich each of the second engaging parts 21b from both sides. Each pair of the slant faces 5d is formed such that the distance between them becomes gradually wider toward the longitudinal direction. The slant faces 5c of the second engaging part 21b and the slant faces 5d of the module case 22 are brought into contact with each other when the connection unit 2a is held by the base unit 1.

As shown in FIG. 5, the module case 22 has notches 22b on both sides in the lateral direction of the module case 22 formed in such a manner as to be along the plurality of guide parts 15 of the front cover 12a. Each notch 22b is shaped like a notch after a rectangular parallelepiped is extracted.

By the notches 22b being formed as described above, a portion of the module case 22 is placed between the second holding part 14b and one of the guide parts 15 of the base unit 1 when the connection unit 2a is held by the base unit 1.

A packing 30, which is a sealing member for sealing the gap between the base case 12 and the fitting tenon 22a of the module case 22, is provided on the lateral face 22aa which is a part of the fitting tenon 22a of the module case 22 and is parallel to the longitudinal direction. The leaf spring 31, which is an elastic member, is provided on the side of the module case 22 facing the base unit 1.

Next, a mechanism for reducing the load on the packing 30 in the PLC configured as described above will be described.

Figure 7:
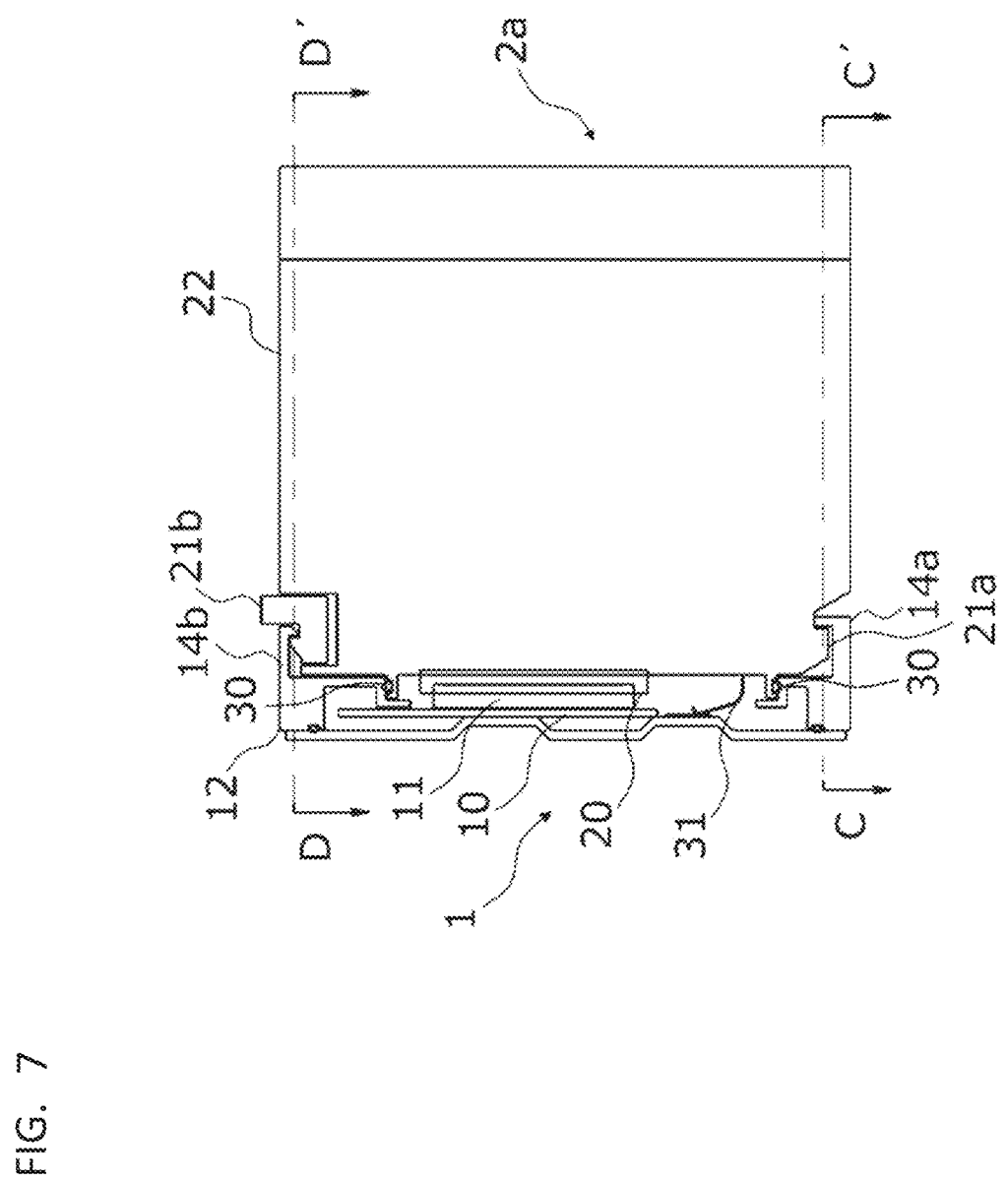
FIG. 7 is an A-A' cross-sectional view of the PLC according to Embodiment 1.

FIG. 7 shows an A-A' cross-sectional view of the PLC in a state where the connection unit 2a is held by the base unit 1. The first engaging part 21a of the connection unit 2a and the first holding part 14a of the base unit 1 are engaged, and the second engaging part 21b of the connection unit 2a and the second holding part 14b of the base unit 1 are engaged, so that the connection unit 2a is held by the base unit 1. At this point, the base-side connector 11 and the module-side connector 20 are connected. Since the leaf spring 31 contacts the rear cover 12b and applies force toward the longitudinal direction, the engagement mechanism 21 of the connection unit 2a is pressed against the pair of holding parts 14 of the base unit 1.

Even when an external force is applied in the direction from the connection unit 2a toward the base unit 1, that is, even when an external force is applied in the direction opposite to the longitudinal direction, the external force can be counteracted by the force applied toward the longitudinal direction by the leaf spring 31. Therefore, since the vibration of the connection unit 2a can be suppressed, the load on the packing 30 can be reduced.

Figure 8:
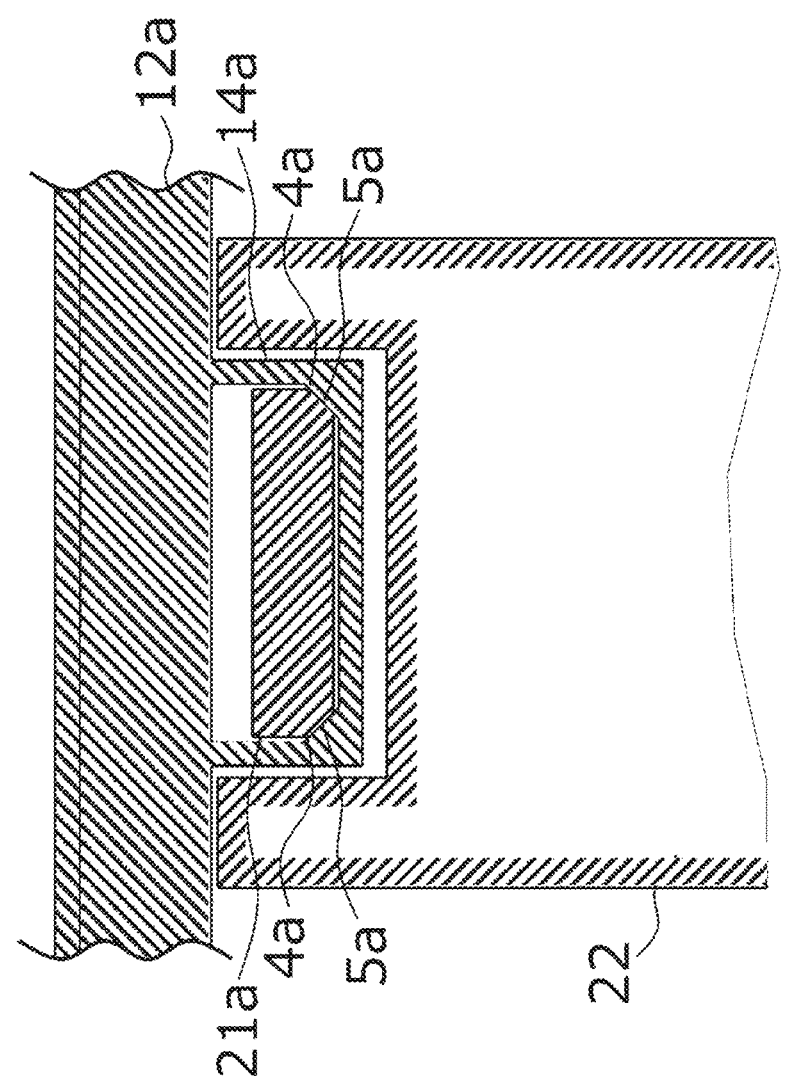
FIG. 8 is a C-C' cross-sectional view of the PLC according to Embodiment 1.

FIG. 8 shows an enlarged C-C' cross-sectional view of an engagement portion of the first holding part 14a and the first engaging part 21a. The first holding part 14a has the slant faces 4a inclined such that the width in the lateral direction becomes gradually narrower toward the longitudinal direction. The first engaging part 21a has slant faces 5a inclined with respect to the longitudinal direction such that the force exerted by the leaf spring 31 is applied in the lateral direction. The slant faces 5a are inclined such that the width in the lateral direction becomes gradually narrower toward the longitudinal direction.

The slant faces 4a of the first holding part 14a and the slant faces 5a of the first engaging part 21a are brought into contact with each other when the connection unit 2a is held by the base unit 1. By the slant faces 5a being pressed against the slant faces 4a due to the force of the leaf spring 31 toward the longitudinal direction, the force of the leaf spring 31 is converted into the force in the lateral direction. Therefore, even when an external force is applied in the lateral direction, the external force is counteracted by the force in the lateral direction converted by the slant faces 4a or the slant faces 5a. As a result of this suppression, the vibration of the connection unit 2a is suppressed so that the load on the packing 30 can be reduced.

Figure 9:
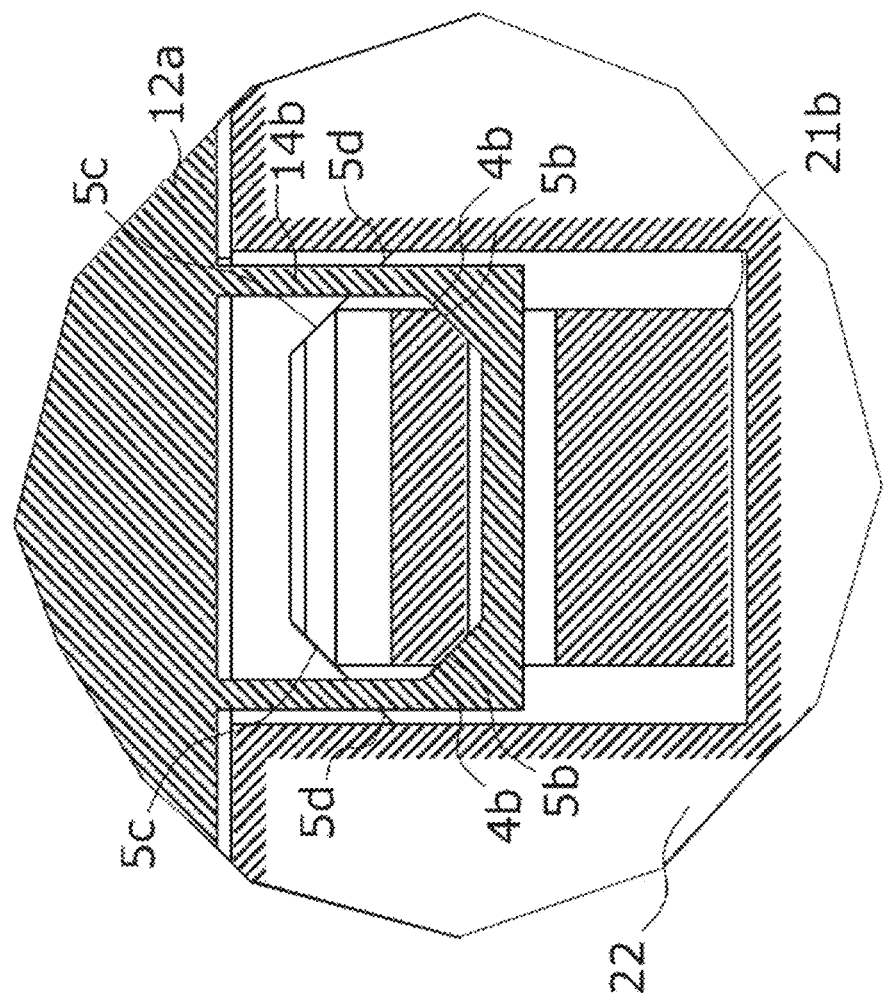
FIG. 9 is a D-D' cross-sectional view of the PLC according to Embodiment 1.

FIG. 9 shows an enlarged D-D' cross-sectional view of an engagement portion of the second holding part 14b and the second engaging part 21b. As shown in FIG. 9, the slant faces 4b of the second holding part 14b and the slant faces 5b of the second engaging part 21b are brought into contact with each other when the connection unit 2a is held by the base unit 1. By the slant faces 5b being pressed against the slant faces 4b due to the force of the leaf spring 31 toward the longitudinal direction, the force of the leaf spring 31 is converted into the force in the lateral direction. Therefore, even when an external force is applied in the lateral direction, the external force is counteracted by the force in the lateral direction converted by the slant faces 4b or the slant faces 5b, so that the load on the packing 30 can be reduced.

When the connection unit 2a is held by the base unit 1, the second engaging part 21b engages with the second holding part 14b, which narrows the distances between the slant faces 5c of the second engaging part 21b and the slant faces 5d of the module case 22. As a result, the slant faces 5c and the slant faces 5d are brought into contact with each other. At this point, the slant faces 5c are pressed against the slant faces 5d. This applied force is converted into the force in the lateral direction by the slant faces 5c or the slant faces 5d. Therefore, even when an external force is applied in the lateral direction, the external force is counteracted by the force in the lateral direction converted by the slant faces 5c or the slant faces 5d, and the vibration of the connection unit 2a can be suppressed, so that the load on the packing 30 can be reduced.

Figure 10:
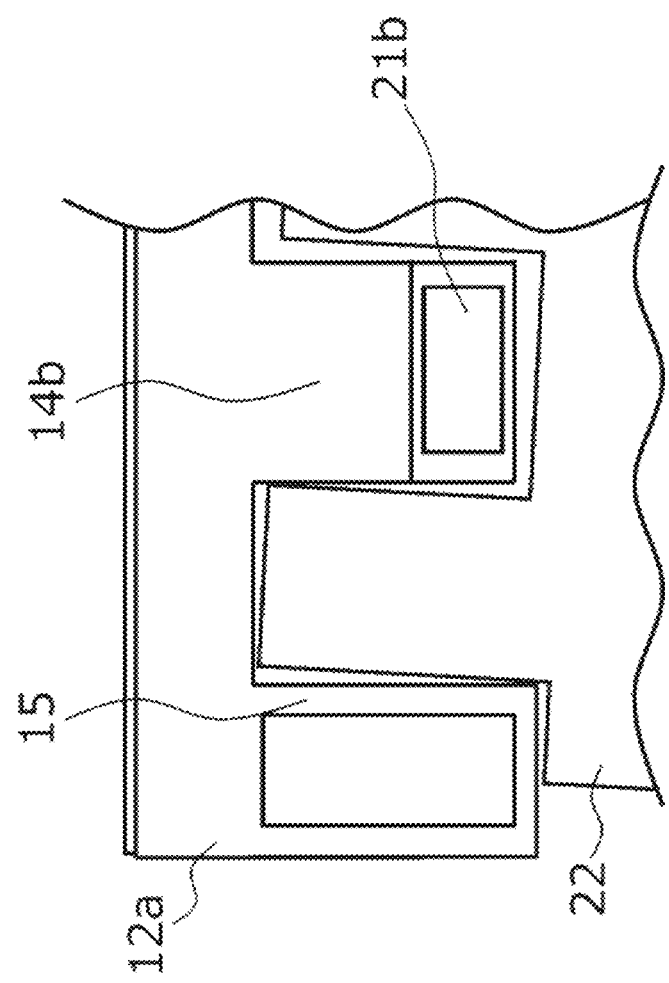
FIG. 10 is a plan view of the PLC according to Embodiment 1.

FIG. 10 shows an enlarged plan view of adjacent portions of the guide part 15 and the module case 22 when an external force is applied in the lateral direction. Portions of the module case 22 sandwiched between the second holding part 14b and the guide part 15 are brought into contact with the second holding part 14b and the guide part 15 when an external force is applied in the lateral direction. As described above, by portions of the module case 22 being brought into contact with the second holding part 14b and the guide part 15, further movement of the connection unit 2a in the lateral direction can be restricted. That is, it is possible to suppress the vibration of the connection unit 2a. Therefore, the load on the packing 30 can be reduced.

In the PLC provided with the leaf spring 31 which presses the engagement mechanism 21 of the connection unit 2a against the pair of holding parts 14 of the base unit 1 by applying a force toward the longitudinal direction as described above and the packing 30 which seals the gap between the base case 12 and the fitting tenon 22a of the module case 22, even when an external force is applied toward the direction opposite to the longitudinal direction, the external force can be counteracted because the leaf spring 31 applies the force toward the longitudinal direction. Therefore, since the vibration of the connection unit 2a can be suppressed, the load on the packing 30 can be reduced. As a result, the packing 30 is less likely to be damaged by twisting, rubbing, or the like, and the waterproofness or the dustproofness of the packing 30 can be maintained.

At the one end of the front cover 12a, the first holding part 14a and the first engaging part 21a are engaged, and at the other end thereof, the second holding part 14b and the second engaging part 21b are engaged. Further, at the other end of the front cover 12a, a portion of the module case 22 is sandwiched between the guide part 15 and the second holding part 14b. As described above, since the external force in the lateral direction can be counteracted at the both ends in the height direction, the load on the packing 30 can be further reduced. Therefore, the packing 30 is less likely to be damaged, and the waterproofness or the dustproofness by the packing 30 can be maintained.

Furthermore, in the PLC according to Embodiment 1, the packing 30 for sealing the gap between the base case 12 and the fitting tenon 22a of the module case 22 is provided on the lateral face 22aa of the fitting tenon 22a of the module case 22. By the packing 30 being arranged as described above, it is possible to prevent a gap from opening between the base case 12 and the fitting tenon 22a of the module case 22 due to the force of the leaf spring 31 toward the longitudinal direction. Therefore, the waterproofness or the dustproofness of the packing 30 can be maintained.

Furthermore, in the PLC according to Embodiment 1, the slant faces 4a and 4b of the pair of holding parts 14 are inclined with respect to the longitudinal direction such that the force of the leaf spring 31 is applied in the lateral direction. In other words, the slant faces 4a of the first holding part 14a are inclined such that the width in the lateral direction becomes gradually narrower toward the longitudinal direction. The slant faces 4b of the second holding part 14b are formed such that the distance between the two slant faces 4b becomes gradually narrower toward the longitudinal direction. By the slant faces 4a and 4b being formed as described above, the force exerted by the leaf spring 31 toward the longitudinal direction is converted into the force in the lateral direction. Therefore, even when an external force is applied in the lateral direction, the external force is counteracted by the force in the lateral direction converted by the slant faces 4a and 4b. Therefore, since the vibration of the connection unit 2a can be suppressed, the load on the packing 30 can be reduced. As a result, the packing 30 is less likely to be damaged, and the waterproofness or the dustproofness of the packing 30 can be maintained.

Furthermore, in the PLC according to Embodiment 1, the slant faces 5a and 5b of the engagement mechanism 21 are inclined with respect to the longitudinal direction such that the force exerted by the leaf spring 31 is applied in the lateral direction. In other words, the slant faces 5a of the first engaging part 21a are inclined such that the width in the lateral direction becomes gradually narrower toward the longitudinal direction. The slant faces 5b of the second engaging part 21b are formed to be inclined such that the width in the lateral direction becomes gradually narrower toward the longitudinal direction. By the slant faces 5a and 5b being formed as described above, the force exerted by the leaf spring 31 toward the longitudinal direction is converted into the force in the lateral direction. Therefore, even when an external force is applied in the lateral direction, the external force is counteracted by the force in the lateral direction converted by the slant faces 5a and 5b. Therefore, since the vibration of the connection unit 2a can be suppressed, the load on the packing 30 can be reduced. As a result, the packing 30 is less likely to be damaged, and the waterproofness or the dustproofness of the packing 30 can be maintained.

Furthermore, in the PLC according to Embodiment 1, the slant faces 5d of the module case 22 are inclined such that the width in the lateral direction becomes gradually wider toward the longitudinal direction. When the connection unit 2a is held by the base unit 1, the second engaging part 21b engages with the second holding part 14b, which narrows the distances between the slant faces 5c of the second engaging part 21b and the slant faces 5d of the module case 22. As a result, the slant faces 5c and the slant faces 5d are brought into contact with each other. At this point, the slant faces 5c are pressed against the slant faces 5d. This applied force is converted into the force in the lateral direction by the slant faces 5c or the slant faces 5d. Therefore, even when an external force is applied in the lateral direction, the external force is counteracted by the force in the lateral direction converted by the slant faces 5c or the slant faces 5d. As a result, the vibration of the connection unit 2a can be suppressed so that the load on the packing 30 can be reduced. Thus, the packing 30 is less likely to be damaged, and the waterproofness or the dustproofness of the packing 30 can be maintained.

Furthermore, in the PLC according to Embodiment 1, the base unit 1 is provided with the plurality of guide parts 15 formed in such a manner as to extend toward the longitudinal direction, and the module case 22 is provided with the notches 22b formed in such a manner as to be along the plurality of guide parts 15. Thus, when the connection unit 2a is held by the base unit 1, two of the plurality of guide parts 15 are brought adjacent to the module case 22. At this point, a portion of the module case 22 is placed between the second holding part 14b and one of the guide parts 15. The module case 22 is brought into contact with the second holding part 14b and the guide parts 15 when an external force is applied in the lateral direction. Therefore, further movement of the connection unit 2a in the lateral direction can be restricted. That is, since the vibration of the connection unit 2a can be suppressed, the load on the packing 30 can be reduced. Thus, the packing 30 is less likely to be damaged, and the waterproofness or the dustproofness of the packing 30 can be maintained.

An example has been described above in which two of the plurality of guide parts 15 are brought adjacent to the module case 22 when the connection unit 2a is held by the base unit 1. However, it is also possible to form the guide parts 15 such that three or more of them are brought adjacent to the module case 22. Further, the guide parts 15 do not need to be formed at the other end of the front cover 12a, but may be formed at the one end of the front cover 12a or between the one end and the other end of the front cover 12a.

Note that the guide parts 15 may have a rectangular parallelepiped shape that is not open in the height direction.

The pair of holding parts 14 of the base unit 1 may be formed to extend from the rear cover 12b.

Note that the first holding part 14a of the base unit 1 may be formed to extend from the other end of the front cover 12a, and the second holding part 14b may be formed to extend from the one end of the front cover 12a. In this case, the engagement mechanism 21 of the connection unit 2a is configured such that the first engaging part 21a engages with the first holding part 14a and the second engaging part 21b engages with the second holding part 14b at one end and the other end of the module case 22 in the height direction, respectively.

Figure 11:
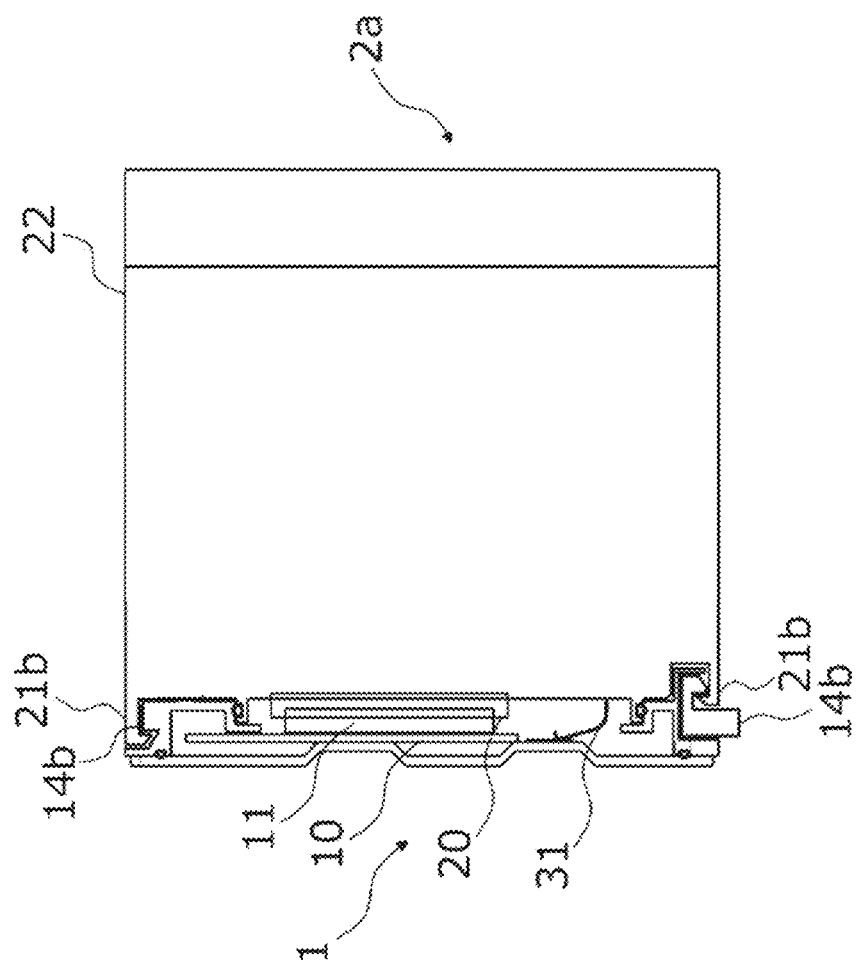
FIG. 11 is an A-A' cross-sectional view showing a modification of the PLC according to Embodiment 1.

Although an example has been described above in which the pair of holding parts 14 of the base unit 1 extends from the front cover 12a toward the longitudinal direction, it is also possible, as shown in FIG. 11, to form the first engaging part 21a and the second engaging part 21b of the connection unit 2a to extend toward the direction opposite to the longitudinal direction. In this case, the pair of holding parts 14 may have any shape as long as the engagement mechanism 21 can be engaged with the pair of holding parts 14. For example, the engagement mechanism 21 may be engaged with the pair of holding parts 14 by hooking the engagement mechanism 21 onto the pair of holding parts 14. Even with such a configuration, the base unit 1 can hold the connection unit 2a.

Figure 12:
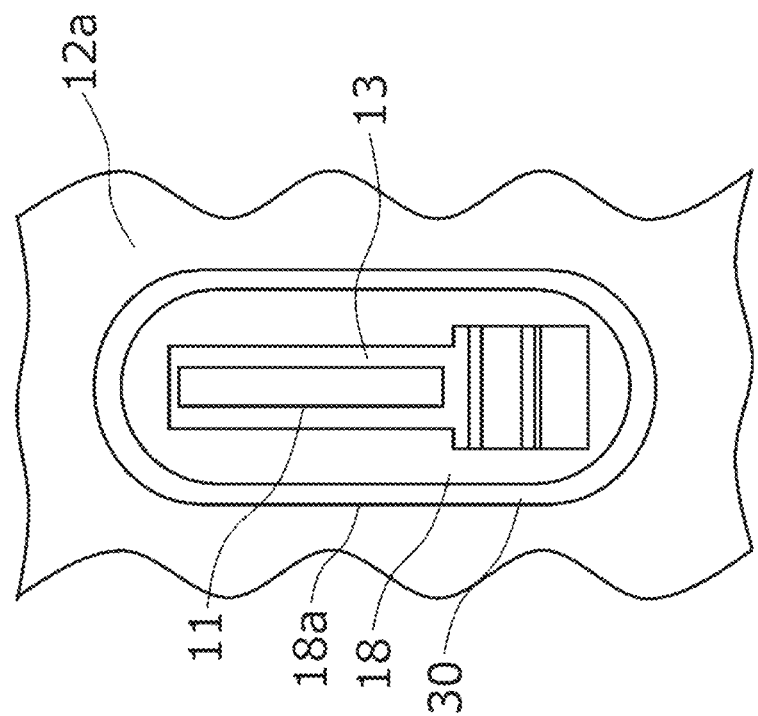
FIG. 12 is a front view showing a modification of the base unit according to Embodiment 1.

Note that the packing 30 may be provided on the opposing face 18a of each of the recesses 18 of the base case 12 facing the lateral face 22aa of the fitting tenon 22a in such a manner as to seal the gap between the base case 12 and the fitting tenon 22a of the module case 22. FIG. 12 shows a front view when the packing 30 is provided on the opposing face 18a.

Note that the elastic member is not limited to the leaf spring 31, and may be any member that can apply force toward the longitudinal direction, such as a coil spring or a rubber member. Further, although an example has been described in which the leaf spring 31 is provided to the connection unit 2a, it may be provided on the side of the base unit 1 facing the module case 22.

Even in the PLC configured as described above, when an external force is applied in the direction opposite to the longitudinal direction, the force toward the longitudinal direction is applied by the leaf spring 31, so that the external force can be counteracted. As a result, the vibration of the connection unit 2a can be suppressed so that the load on the packing 30 can be reduced. As a result, the packing 30 is less likely to be damaged by twisting, rubbing, or the like, and the waterproofness or the dustproofness of the packing 30 can be maintained.

Embodiment 2

In Embodiment 1, an example has been described in which the pair of holding parts 14 of the base unit 1 and the engagement mechanism 21 of the module unit 2 have the slant faces inclined with respect to the longitudinal direction such that the force exerted by the leaf spring 31 is applied in the lateral direction. In Embodiment 2, an example will be described in which the pair of holding parts 14 and the engagement mechanism 21 have slant faces inclined with respect to the longitudinal direction such that the force exerted by the leaf spring 31 is applied in the height direction. Specifically, the directions of inclination of the slant faces of the pair of holding parts 14 and the slant faces of the engagement mechanism 21 are different from those in Embodiment 1. The difference will be described below.

Figure 13:
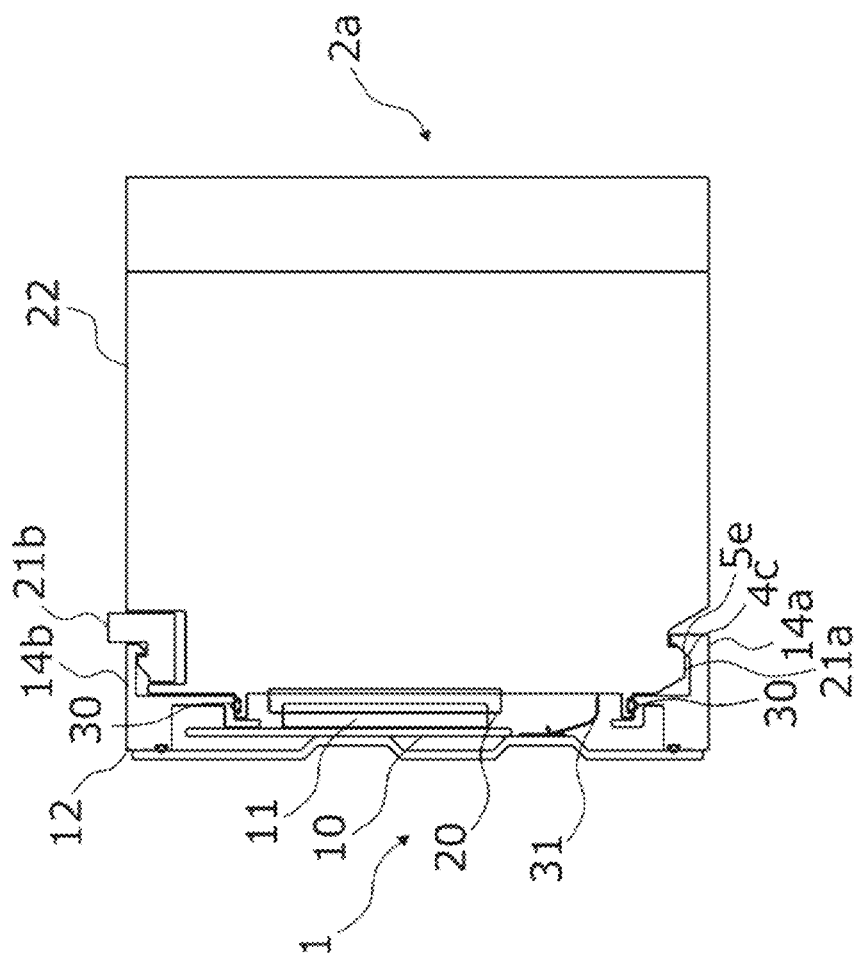
FIG. 13 is an A-A' cross-sectional view of a PLC according to Embodiment 2.

FIG. 13 shows an A-A' cross-sectional view of the PLC in a state where the connection unit 2a is held by the base unit 1. As shown in FIG. 13, the first holding part 14a of the base unit 1 has a slant face 4c inclined with respect to the longitudinal direction such that the force exerted by the leaf spring 31 is applied in the height direction. The slant face 4c is inclined such that it gradually approaches the side of the second holding part 14b toward the longitudinal direction.

The first engaging part 21a of the connection unit 2a has a slant face 5e inclined with respect to the longitudinal direction such that the force exerted by the leaf spring 31 is applied in the height direction. The slant face 5e is inclined such that it gradually approaches the side of the second holding part 14b toward the longitudinal direction.

Next, a mechanism for reducing the load on the packing 30 in the PLC configured as described above will be described. When the connection unit 2a is held by the base unit 1, the slant face 4c of the first holding part 14a and the slant face 5e of the first engaging part 21a are brought into contact with each other. By the slant face 5e being pressed against the slant face 4c by the force exerted by the leaf spring 31 toward the longitudinal direction, the force exerted by the leaf spring 31 is converted into the force in the height direction directed from the first holding part 14a to the second holding part 14b. Therefore, even when an external force is applied from the second holding part 14b toward the first holding part 14a, the external force is counteracted by the force in the height direction converted by the slant face 4c or the slant face 5e. Therefore, since the vibration of the connection unit 2a can be suppressed, the load on the packing 30 can be reduced. As a result, the packing 30 is less likely to be damaged by twisting, rubbing, or the like, and the waterproofness or the dustproofness of the packing 30 can be maintained.

Figure 14:
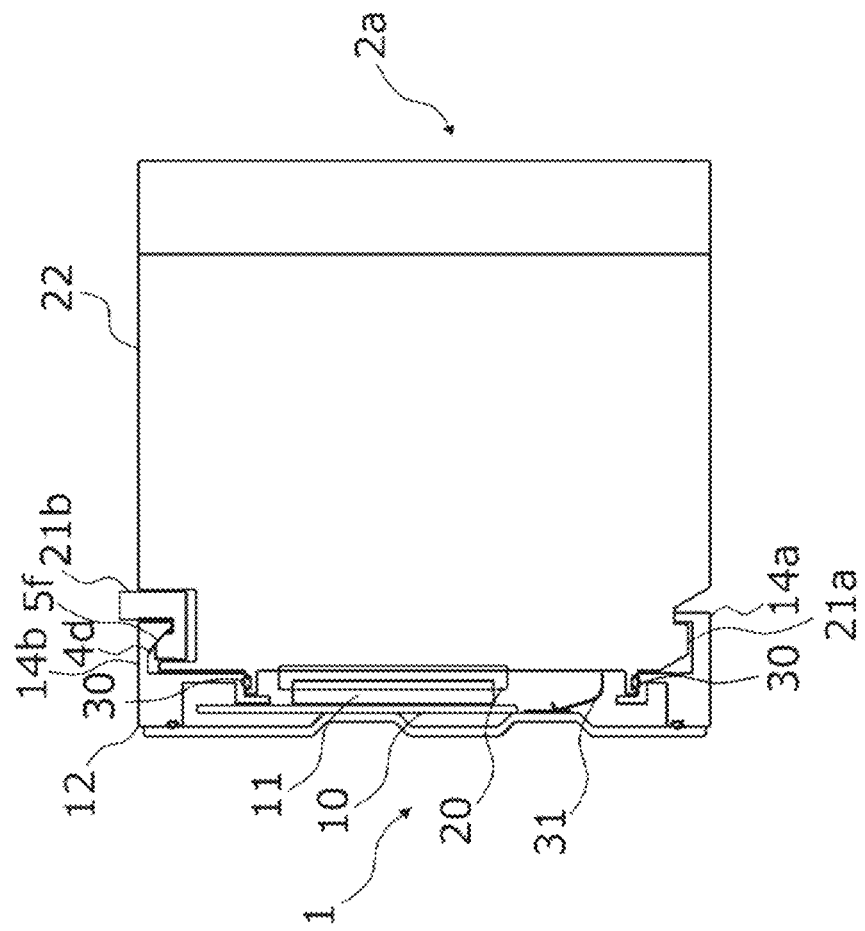
FIG. 14 is an A-A' cross-sectional view showing a modification of the PLC according to Embodiment 2.

Note that, as shown in FIG. 14, a slant face 4d inclined such that it gradually approaches the side of the first holding part 14a toward the longitudinal direction may be formed in the second holding part 14b of the base unit 1. Further, a slant face 5f inclined such that it gradually approaches the side of the first holding part 14a toward the longitudinal direction may be formed in the second engaging part 21b of the connection unit 2a. In the case of the slant faces formed as described above, the force exerted by the leaf spring 31 is converted into the force in the height direction directed from the second holding part 14b to the first holding part 14a. Therefore, even when an external force is applied in the direction from the first holding part 14a to the second holding part 14b, the external force is counteracted by the force in the height direction converted by the slant face 4d or the slant face 5f. Therefore, since the vibration of the connection unit 2a can be suppressed, the load on the packing 30 can be reduced. Therefore, the packing 30 is less likely to be damaged, and the waterproofness or the dustproofness by the packing 30 can be maintained.

Embodiment 3

In Embodiment 1, an example has been described in which the guide parts 15 of a hollow rectangular parallelepiped shape are formed extending from the other end of the front cover 12a toward the longitudinal direction. In Embodiment 3, in contrast, an example will be described in which guide parts 17 of a hollow trapezoidal shape are formed. Specifically, since the guide parts 17 differ from those of Embodiment 1 in that they each have slant faces 4e inclined with respect to the longitudinal direction, the difference will be described below.

Figure 15:
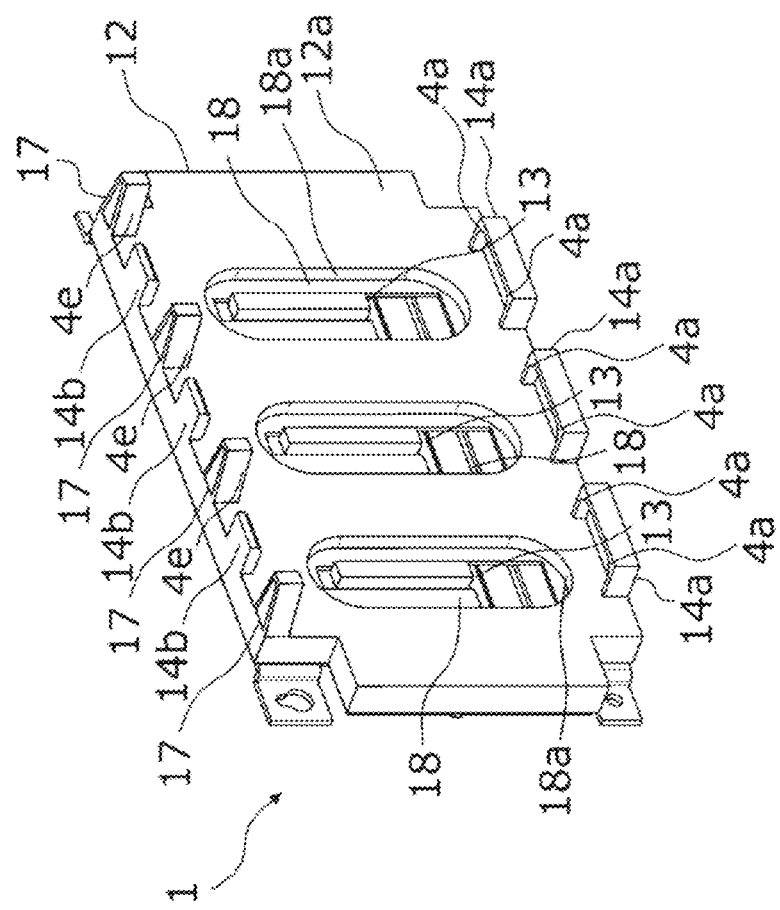
FIG. 15 is a perspective view of a base unit according to Embodiment 3.

As shown in FIG. 15, the front cover 12a has the plurality of guide parts 17 formed extending from the other end of the front cover 12a toward the longitudinal direction. Each of the guide parts 17 has a hollow trapezoidal shape open on both sides of the height direction. The plurality of guide parts 17 are provided such that when the connection unit 2a is held by the base unit 1, two of the guide parts 17 are brought adjacent to the module case 22.

Figure 16:
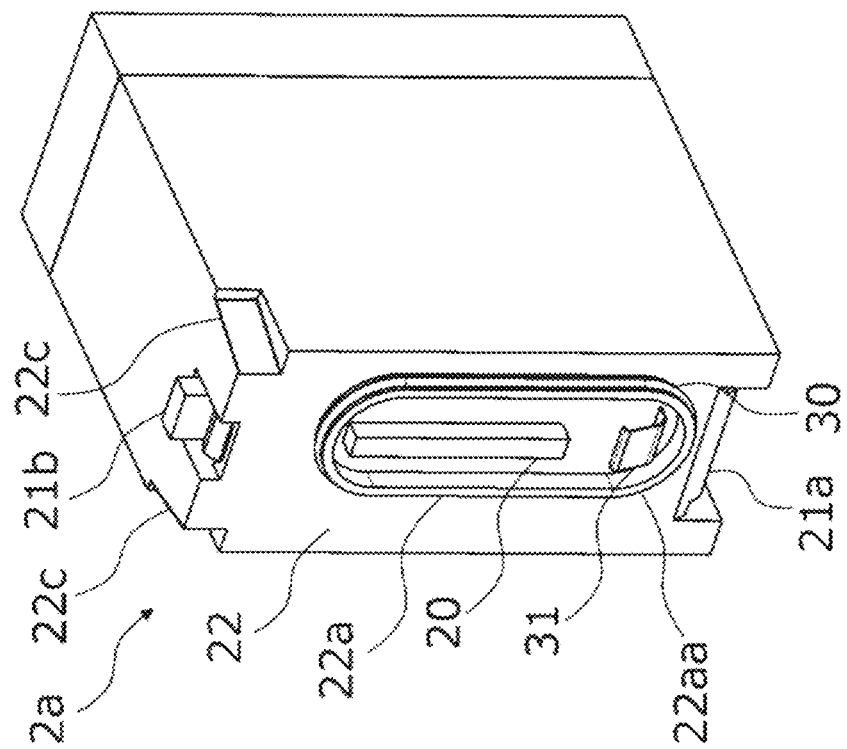
FIG. 16 is a perspective view of a connection unit according to Embodiment 3.

FIG. 16 shows a perspective view from the rear side of the connection unit 2a. The module case 22 has notches 22c on both sides in the lateral direction of the module case 22 formed in such a manner as to be along the plurality of guide parts 17. Each notch 22c is shaped like a notch after a trapezoidal column is extracted. By the notches 22c being formed as described above, a portion of the module case 22 is placed between the second holding part 14b and one of the guide parts 17 of the base unit 1 when the connection unit 2a is held by the base unit 1.

Figure 17:
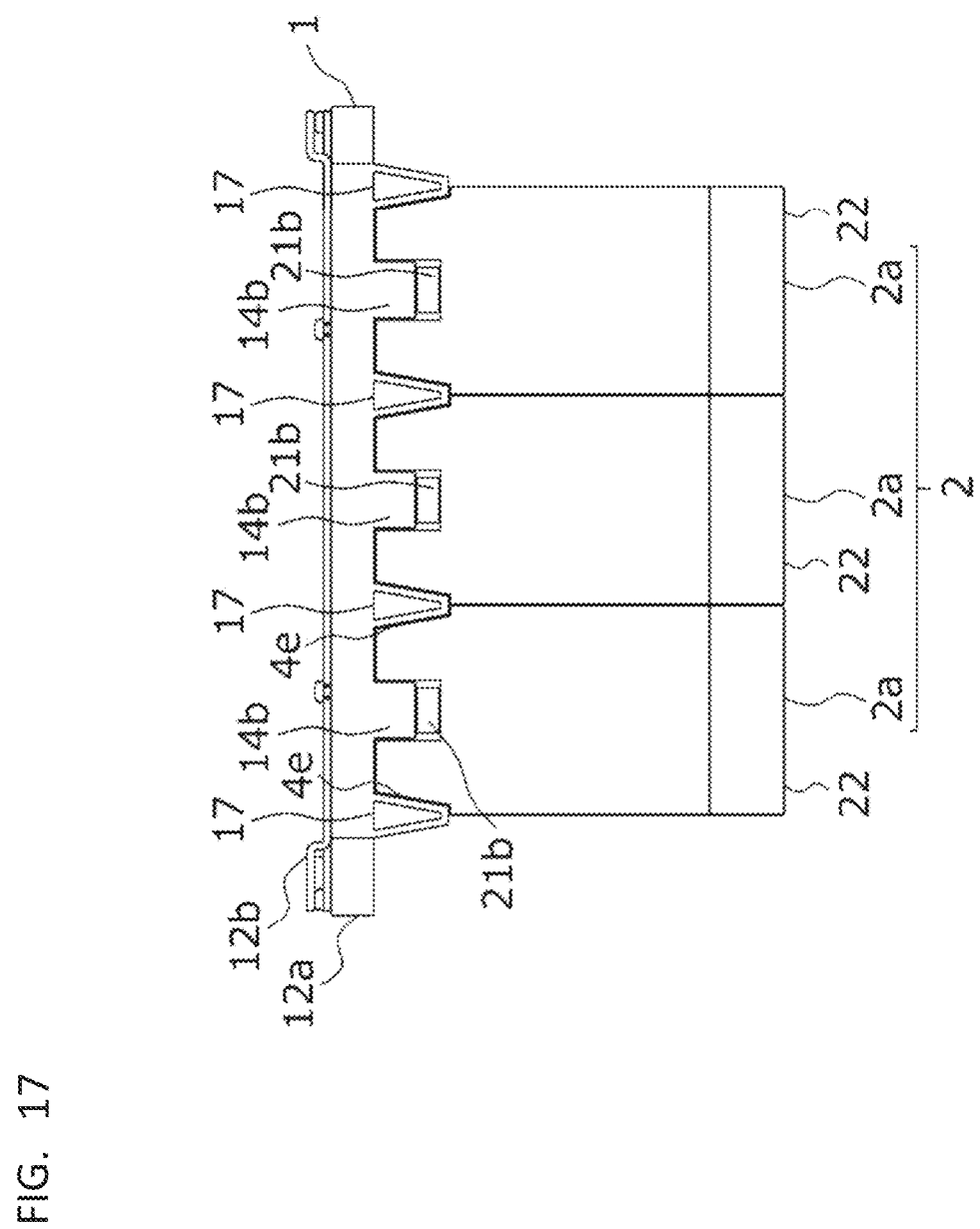
FIG. 17 is a plan view of a PLC according to Embodiment 3.

FIG. 17 shows a plan view of the PLC. As shown in FIG. 17, the plurality of guide parts 17 each have the slant faces 4e inclined such that the width in the lateral direction becomes gradually narrower toward the longitudinal direction.

Figure 18:
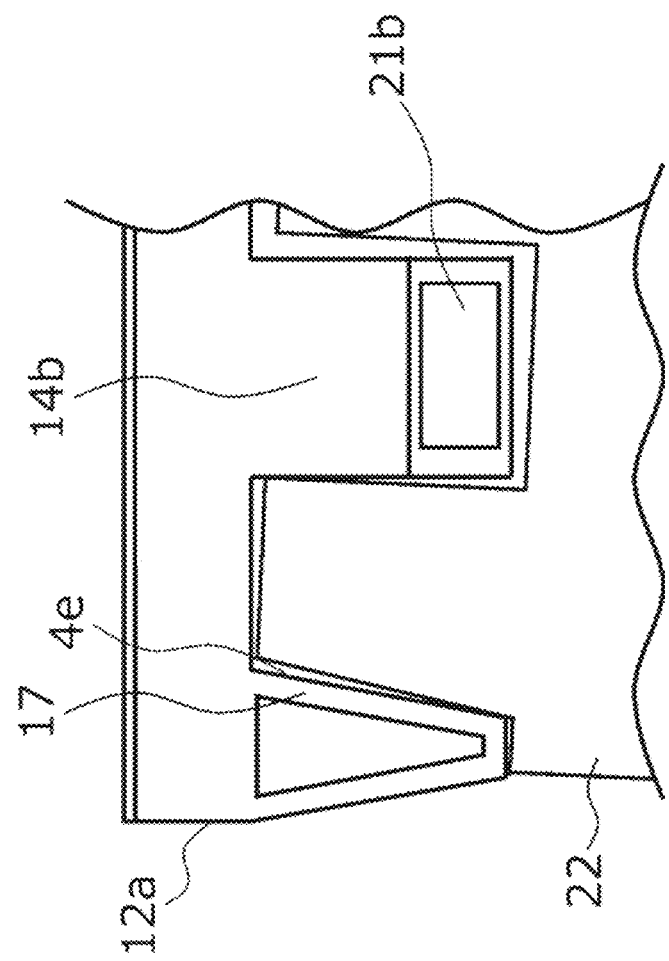
FIG. 18 is a plan view of the PLC according to Embodiment 3.

FIG. 18 shows an enlarged plan view of adjacent portions of the guide part 17 and the module case 22 when an external force is applied in the lateral direction. Portions of the module case 22 sandwiched between the second holding part 14b and the guide part 17 are brought into contact with the second holding part 14b and the guide part 17 when an external force is applied in the lateral direction. As described above, by portions of the module case 22 being brought into contact with the second holding part 14b and the guide part 17, further movement of the connection unit 2a in the lateral direction can be restricted. That is, since the vibration of the connection unit 2a can be suppressed, the load on the packing 30 can be reduced. As a result, the packing 30 is less likely to be damaged by twisting, rubbing, or the like, and the waterproofness or the dustproofness of the packing 30 can be maintained.

Furthermore, since the guide part 17 has the slant faces 4e, the contact area between the connection unit 2a and the guide part 17 can be increased when an external force is applied from the lateral direction such that the connection unit 2a approaches the slant faces 4e and thus the connection unit 2a is brought into contact with the guide part 17. Therefore, even when, for example, an external force causing a lateral movement of the connection unit 2a, which cannot be restricted if the contact area between the connection unit 2a and the guide part 17 is small, is applied to the module case 22, the large contact area realized by the slant faces 4e provided to the guide part 17 makes it possible to restrict the connection unit 2a from moving in the lateral direction.

By the shape of the guide parts 17 being set to the hollow trapezoidal shape, the volume of the module case 22 occupied by the notches 22c can be reduced compared to when the guide parts 17 have the hollow rectangular parallelepiped shape. Therefore, the volume of the module case 22 can be increased. Therefore, a plurality of electronic components built in the module case 22 can be placed apart from each other, and thus heat dissipation of the electronic components can be improved.

Note that the guide part 17 does not have to have the hollow trapezoidal shape as long as it has a shape provided with the slant faces 4e, and may have a triangular prism shape.

Note that the slant faces 4e of the guide part 17 may be inclined such that the width in the height direction gradually becomes narrower toward the longitudinal direction. Even with such guide parts 17, the volume of the module case 22 occupied by the notches 22c can be reduced compared to when the guide parts 17 have the hollow rectangular parallelepiped shape. Therefore, the volume of the module case 22 can be increased.

Embodiment 4

In Embodiment 1, an example has been described in which a portion of the module case 22 is placed between the second holding part 14b and one of the guide parts 15 of the base unit 1 when the connection unit 2a is held by the base unit 1. In Embodiment 4, an example will be described in which protrusions are provided between the guide parts 15 and the module case 22. Specifically, since the guide parts 15 and the module case 22 differ from those of Embodiment 1 in that they have protrusions that protrude in the lateral direction, the differences will be described below.

Figure 19:
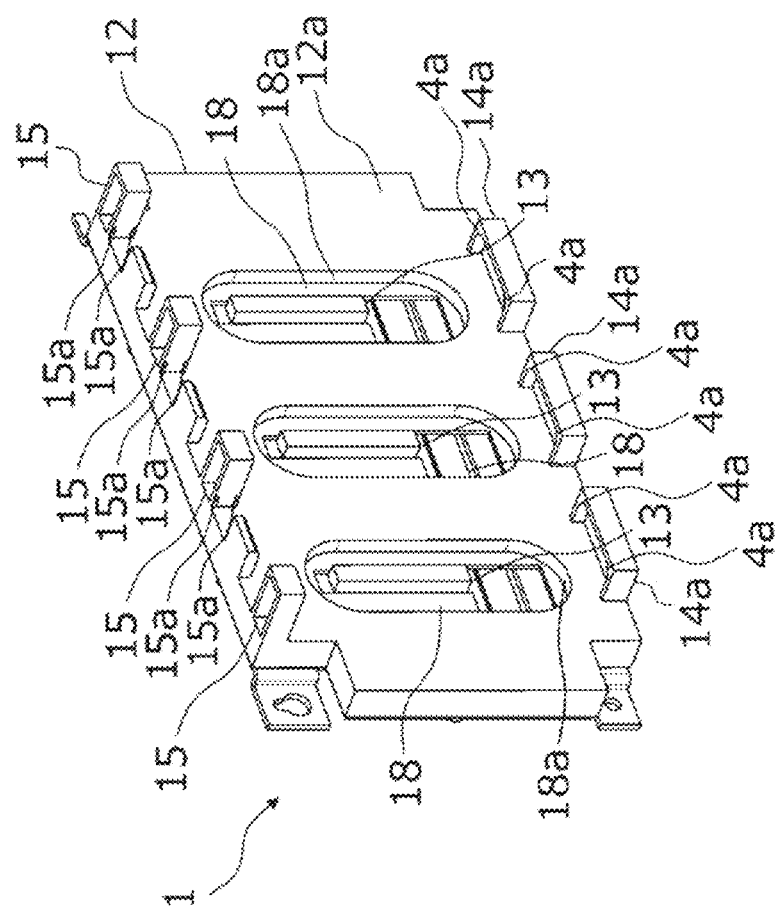
FIG. 19 is a perspective view of a base unit according to Embodiment 4.

As shown in FIG. 19, the front cover 12a has the plurality of guide parts 15 formed in such a manner as to extend toward the longitudinal direction from the other end of the front cover 12a. The guide parts 15 each have a hollow rectangular parallelepiped shape open on both sides of the height direction. The guide parts 15 have protrusions 15a that protrude in the lateral direction. The protrusions 15a are formed at the rear sides on the surfaces of the guide parts 15 parallel to the longitudinal direction. Two of the protrusions 15a are formed on each surface, arranged parallel to the height direction. That is, four of the protrusions 15a are formed for each of the guide parts 15.

Figure 20:
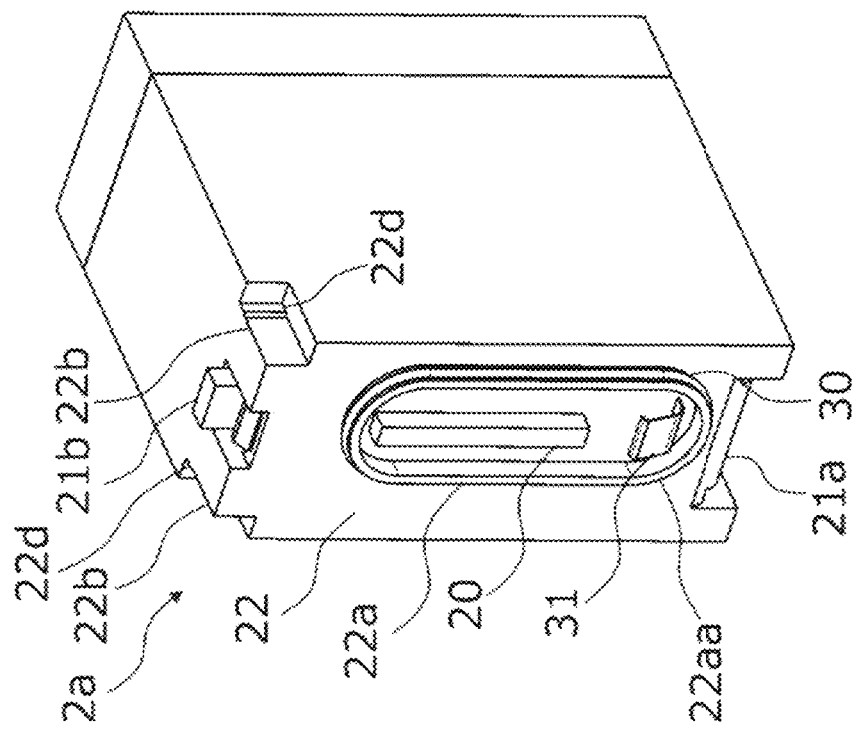
FIG. 20 is a perspective view of a connection unit according to Embodiment 4.

As shown in FIG. 20, the connection unit 2a includes the module case 22. Protrusions 22d that protrude in the lateral direction are provided at the front sides on surfaces of the module case 22, the surfaces being brought adjacent to the guide parts 15 when the connection unit 2a is held by the base unit 1. The protrusions 22d are formed on both sides of the module case in the lateral direction, one on each side.

Figure 21:
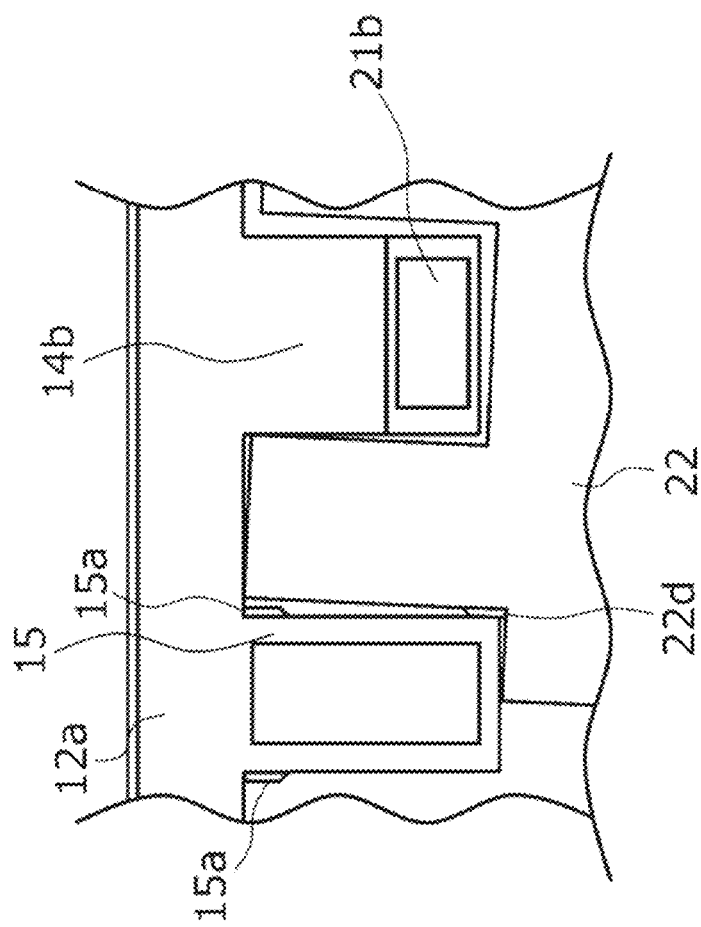
FIG. 21 is a plan view of a PLC according to Embodiment 4.

FIG. 21 shows an enlarged plan view of adjacent portions of the guide part 15 and the module case 22 when an external force is applied in the lateral direction. When an external force is applied to the connection unit 2a in the lateral direction, a portion of the module case 22 sandwiched between the second holding part 14b and the guide part 15 is brought into contact with the second holding part 14b, and one of the protrusions 22d of the module case 22 is brought into contact with the guide part 15. By the protrusions 22d being formed as described above, the movement of the connection unit 2a in the lateral direction can be restricted earlier than when the protrusions 22d are not formed. Therefore, the load on the packing 30 can be further reduced. As a result, the packing 30 is less likely to be damaged by twisting, rubbing, or the like, and the waterproofness or the dustproofness of the packing 30 can be maintained.

Furthermore, when an external force is applied to the connection unit 2a in a direction opposite to the direction mentioned above, a portion of the module case 22 sandwiched between the second holding part 14b and the guide part 15 is brought into contact with the second holding part 14b, and portions of the module case 22 are brought into contact with the protrusions 15a of the guide part 15. By the protrusions 15a being formed as described above, the movement of the connection unit 2a in the lateral direction can be restricted earlier than when the protrusions 15a are not formed. That is, since the vibration of the connection unit 2a can be suppressed, the load on the packing 30 can be further reduced. As a result, the packing 30 is less likely to be damaged by twisting, rubbing, or the like, and the waterproofness or the dustproofness of the packing 30 can be maintained.

A protrusion may be provided on the surface of the second holding part 14b to be adjacent to the module case 22.

The protrusions 15a of the guide part 15 may be formed on the front side, and the protrusions 22d of the module case 22 may be formed on the rear side.

If the protrusions 22d are not formed in the module case 22, the protrusions 15a and the protrusions 22d may be formed in the guide part 15. Similarly, if the protrusions 15a are not formed in the guide part 15, the protrusions 15a and the protrusions 22d may be formed in the module case 22.

In Embodiments 1 to 4, examples have been described in which various configurations and combinations thereof for the pair of holding parts 14, the guide parts 15 and 17, and the engagement mechanism 21 are shown, but the embodiments are not limited thereto. For example, in order to maintain the waterproofness or the dustproofness by the packing 30, it is possible to adopt a different combination of the configurations described in each of the embodiments. Specifically, the pair of holding parts 14 and the engagement mechanism 21 may be provided with slant faces inclined in different directions from each other, such as the lateral direction and the height direction. Also, slant faces may be provided in one of the pair of holding parts 14 and the engagement mechanism 21. Furthermore, the pair of holding parts 14 may be configured to have a plurality of slant faces inclined in different directions, and the engagement mechanism 21 may be configured to have a plurality of slant faces inclined in different directions. Further, the guide parts 15 and 17 may be used in combination with the pair of holding parts 14 and the engagement mechanism 21 described in another embodiment.

EXPLANATION OF SYMBOLS

1 . . . base unit,
10 . . . substrate,
11 . . . base-side connector,
12 . . . base case,
13 . . . opening,
14 . . . pair of holding parts,
14a . . . first holding part,
14b . . . second holding part,
15 . . . guide part,
15a . . . protrusion,
2 . . . module unit,
17 . . . guide part,
2a . . . connection unit,
20 . . . module-side connector,
21 . . . engagement mechanism,
21a . . . first engaging part,
21b . . . second engaging part,
22 . . . module case,
22a . . . fitting tenon,
22b . . . notch,
22c . . . notch,
22d . . . protrusion,
30 . . . packing,
31 . . . leaf spring,
4a . . . slant face,
4b . . . slant face,
4c . . . slant face,
4d . . . slant face,
4e . . . slant face,
5a . . . slant face,
5b . . . slant face,
5c . . . slant face,
5d . . . slant face,
5e . . . slant face,
5f . . . slant face

The invention claimed is:

1. A programmable logic controller comprising:
a base unit; and
a plurality of module units to be connected to the base unit,
wherein the base unit comprises:
  a substrate having a plurality of base-side connectors and electrically connecting the plurality of module units via the plurality of base-side connectors;
  a base case having an opening through which one of the plurality of base-side connectors is exposed and housing the substrate; and
  at least one holding part to hold a connection unit which is one of the plurality of module units,
wherein
  the connection unit comprises:
    a module-side connector to be connected to one of the plurality of base-side connectors;
    an engagement mechanism to be detachably engaged with the at least one holding part of the base unit; and
    a module case having a fitting tenon formed in such a manner as to be fitted with the base case and to surround the module-side connector,
wherein
  the programmable logic controller further comprises:
    an elastic member to exert a force in a first direction, which is a direction in which the connection unit moves away from the base unit, for pressing the engagement mechanism of the connection unit against the at least one holding part of the base unit; and
    a sealing member to seal a gap between the base case and the fitting tenon of the module case,
and wherein
  the at least one holding part is provided in plurality to form pairs, and
  the pair of holding parts has at least one slant face inclined with respect to the first direction such that the force exerted by the elastic member is applied in a second direction intersecting the first direction.

2. The programmable logic controller according to claim 1, wherein the sealing member is provided on a lateral face of the fitting tenon, the lateral face being parallel to the first direction, or on an opposing face of the base case, the opposing face facing the lateral face of the fitting tenon.

3. The programmable logic controller according to claim 1, wherein the second direction is parallel to a direction from one holding part to the other holding part in the pair of holding parts, and the at least one slant face is inclined such that it gradually approaches a side of the other holding part toward the first direction.

4. The programmable logic controller according to claim 1,
  wherein the second direction is a direction perpendicular to both the first direction and a direction from one holding part to the other holding part in the pair of holding parts, and
  wherein the at least one slant face is provided in plurality such that the engagement mechanism of the connection unit is sandwiched from both sides and a distance between the slant faces becomes gradually narrower toward the first direction, thereby the force exerted by the elastic member being applied in the second direction.

5. The programmable logic controller according to claim 1, wherein the engagement mechanism has at least one slant face inclined with respect to the first direction such that the force exerted by the elastic member is applied in the second direction intersecting the first direction.

6. The programmable logic controller according to claim 5, wherein the second direction is parallel to a direction from one holding part to the other holding part in the pair of holding parts, and one of the at least one slant face is inclined such that it gradually approaches a side of the other holding part from a side of the one holding part toward the first direction.

7. The programmable logic controller according to claim 5, wherein the second direction is a direction perpendicular to both the first direction and a direction from one holding part to the other holding part in the pair of holding parts, and the engagement mechanism has a plurality of slant faces inclined such that its width in the second direction becomes gradually narrower toward the first direction.

8. The programmable logic controller according to claim 1, wherein the module case has a plurality of slant faces sandwiching the engagement mechanism from both sides, and a distance between the slant faces becomes gradually wider toward the first direction.

9. The programmable logic controller according to claim 1,
  wherein the base unit further comprises a plurality of guide parts formed in such a manner as to extend toward the first direction,
  wherein the module case has notches formed in such a manner as to be along the plurality of guide parts, and
  wherein at least two of the plurality of guide parts are brought adjacent to the module case when the connection unit is held by the base unit.

10. The programmable logic controller according to claim 9, wherein at least one of a face of each guide part to be adjacent to the module case and a face of the module case to be adjacent to each guide part has a protrusion.

11. The programmable logic controller according to claim 9, wherein each of the guide parts has at least one slant face inclined such that its width becomes gradually narrower toward the first direction.

12. A base unit of a programmable logic controller provided with the base unit and a plurality of module units to be connected to the base unit, the base unit comprising:
  a substrate having a plurality of base-side connectors and electrically connecting the plurality of module units via the plurality of base-side connectors;
  a base case having openings through which the plurality of base-side connectors are exposed and housing the substrate;
  at least one holding part to hold a connection unit which is one of the plurality of module units by being engaged with an engagement mechanism of the connection unit;
  an elastic member to exert a force in a first direction, which is a direction in which the connection unit moves away from the base unit, for pressing the engagement mechanism of the connection unit against the at least one holding part of the base unit; and
  a sealing member to seal a gap between a fitting tenon of the module case of the connection unit and the base case, the fitting tenon being formed such that it surrounds the module-side connector of the connection unit to be connected to one of the plurality of base-side connectors,
wherein
  the at least one holding part is provided in plurality to form a pair, and
  the pair of holding parts has at least one slant face inclined with respect to the first direction such that the force exerted by the elastic member is applied in a second direction intersecting the first direction.

13. A module unit of a programmable logic controller provided with: a base unit having a substrate with a plurality of base-side connectors, a base case with an opening through which one of the plurality of base-side connectors is exposed and housing the substrate, and at least one holding part to hold another unit; and the module unit to be connected to the base unit, the module unit comprising:
- a module-side connector to be connected to one of the base-side connectors of the base unit;
- an engagement mechanism to be detachably engaged with the at least one holding part of the base unit;
- a module case having a fitting tenon formed in such a manner as to be fitted with the base case and to surround the module-side connector;
- an elastic member to exert a force in a first direction, which is a direction in which the module unit moves away from the base unit, for pressing the engagement mechanism of the module unit against the at least one holding part of the base unit; and
- a sealing member to seal a gap between the base case and the fitting tenon of the module case, wherein
- the at least one holding part is provided in plurality to form a pair, and
- the pair of holding parts has at least one slant face inclined with respect to the first direction such that the force exerted by the elastic member is applied in a second direction intersecting the first direction.

* * * * *